(12) United States Patent
Sato

(10) Patent No.: US 9,373,751 B2
(45) Date of Patent: Jun. 21, 2016

(54) LIGHT EMITTING ELEMENT INCLUDING FIRST ELECTRODE WITH FIRST CONNECTING PORTION AND FIRST EXTENDING PORTION, AND SECOND ELECTRODE WITH SECOND CONNECTING PORTION AND TWO SECOND EXTENDING PORTIONS

(71) Applicant: NICHIA CORPORATION, Anan-shi, Tokushima (JP)

(72) Inventor: Kosuke Sato, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/136,610

(22) Filed: Dec. 20, 2013

(65) Prior Publication Data
US 2014/0183564 A1    Jul. 3, 2014

(30) Foreign Application Priority Data

Dec. 28, 2012  (JP) .................................. 2012-288664
Oct. 24, 2013  (JP) .................................. 2013-220976

(51) Int. Cl.
*H01L 27/088*    (2006.01)
*H01L 33/36*     (2010.01)
(Continued)

(52) U.S. Cl.
CPC ................ *H01L 33/36* (2013.01); *H01L 33/38* (2013.01); *H01L 33/20* (2013.01); *H01L 2924/0002* (2013.01)

(58) Field of Classification Search
CPC . H01L 33/36; H01L 33/38; H01L 2924/0002; H01L 33/20

USPC .......................................................... 257/79
See application file for complete search history.

(56) References Cited

U.S. PATENT DOCUMENTS 6,614,056 B1 *   9/2003  Tarsa ...................... H01L 33/20
                                                    257/88
2003/0107053 A1 *  6/2003  Uemura .................. H01L 33/32
                                                    257/200

(Continued)

FOREIGN PATENT DOCUMENTS

EP        2325900 A1     5/2011
JP       2005-183910 A   7/2005

(Continued)

OTHER PUBLICATIONS

Extended European Search Report of the corresponding European Application No. 13198369.4, dated Sep. 28, 2015.

*Primary Examiner* — Phat X Cao
*Assistant Examiner* — Mohammad M Hoque
(74) *Attorney, Agent, or Firm* — Global IP Counselors, LLP

(57) ABSTRACT

A light emitting element includes a first conductivity-type semiconductor layer, a first electrode, a second conductivity-type semiconductor layer and a second electrode. The second conductivity-type semiconductor layer has a square peripheral shape. The first electrode includes a first connecting portion on a first diagonal line and a first extending portion extending from the first connecting portion onto the first diagonal line. The second electrode includes a second connecting portion on the first diagonal line facing the first connecting portion via the first extending portion. Two second extending portions extend from the second connecting portion and having a first portion and a second portion respectively. The first connecting portion includes an end portion closer to the second connecting portion than a straight line intersecting the tip ends of the two second extending portions, and a center portion at a side father from the second connecting portion than the second diagonal line.

26 Claims, 10 Drawing Sheets

(51) Int. Cl.
*H01L 33/38* (2010.01)
*H01L 33/20* (2010.01)

(56) References Cited

U.S. PATENT DOCUMENTS

| | | | |
|---|---|---|---|
| 2005/0133807 A1 | 6/2005 | Park et al. | |
| 2005/0236637 A1* | 10/2005 | Zhao et al. | 257/99 |
| 2007/0228388 A1* | 10/2007 | Ko et al. | 257/79 |
| 2008/0296603 A1* | 12/2008 | Chu | 257/99 |
| 2011/0147784 A1 | 6/2011 | Brockley et al. | |
| 2011/0156065 A1 | 6/2011 | Kadan et al. | |
| 2011/0156070 A1 | 6/2011 | Yoon et al. | |
| 2011/0156086 A1* | 6/2011 | Kim et al. | 257/99 |
| 2011/0163346 A1* | 7/2011 | Seo et al. | 257/99 |
| 2011/0210345 A1* | 9/2011 | Lim et al. | 257/88 |
| 2011/0215363 A1* | 9/2011 | Kimura | H01L 33/38 257/99 |
| 2012/0018766 A1* | 1/2012 | Emura | H01L 33/38 257/99 |
| 2012/0098023 A1* | 4/2012 | Weng et al. | 257/99 |
| 2013/0248921 A1 | 9/2013 | Kimura et al. | |

FOREIGN PATENT DOCUMENTS

| | | | |
|---|---|---|---|
| JP | 2008-016809 A | | 1/2008 |
| JP | 2011-061077 A | | 3/2011 |
| JP | 2011061077 | * | 3/2011 |
| JP | 2011-139037 A | | 7/2011 |
| JP | 2011-187670 A | | 9/2011 |
| JP | 2012-089695 A | | 5/2012 |
| JP | 2012-169392 A | | 9/2012 |

* cited by examiner

LIGHT EMITTING ELEMENT INCLUDING FIRST ELECTRODE WITH FIRST CONNECTING PORTION AND FIRST EXTENDING PORTION, AND SECOND ELECTRODE WITH SECOND CONNECTING PORTION AND TWO SECOND EXTENDING PORTIONS

CROSS-REFERENCE TO RELATED APPLICATION

This application claims priority to Japanese Patent Applications No. 2012-288664, filed on Dec. 28, 2012 and No. 2013-220976, filed on Oct. 24, 2013. The entire disclosure of Japanese Patent Applications No. 2012-288664 and No. 2013-220976 are hereby incorporated herein by reference.

BACKGROUND OF THE INVENTION

1. Technical Field

The present invention relates to a light emitting element, and particularly to an electrode structure of the light emitting element.

2. Background Art

There have been various developments in the art to obtain uniform emissions from a light emitting element. For example, for a light emitting element having a quadrilateral outer shape, electrode structures in which either a second electrode or a first electrode is disposed at a center portion of an upper surface of a light emitting element, and the other electrode is disposed embracing it (see Patent Literature 1: JP 2011-61077 A, Patent Literature 2: JP 2012-89695 A, and Patent Literature 3: JP 2011-139037 A).

Each of those various electrode structures is proposed aiming to obtain a uniform distribution of current density to obtain an uniform emission over the entire surface of the light emitting element. However, in reality, even with those structures, a deviation in the distribution of current density between the second electrode and the first electrode occurs, which may lead to problems such as an increase in forward voltage (Vf), insufficient for obtaining a uniform emission, and/or a decrease in emission efficiency, etc.

Also, depending on the arrangement of the second electrode and the first electrode, and further on the type of the connection of those electrodes to outside, wires which impede overall emission may present over the light emitting element with a relatively long distance, which may result in a decrease in the light extraction efficiency. The wires arranged over the light emitting element decrease in height from the respective bonding points on the light emitting element toward the outer periphery of the light emitting element which may cause contact of the wires with the outer periphery of the light emitting element, which results in short circuit.

SUMMARY OF THE INVENTION

Accordingly, one aspect of this disclosure is devised to solve the problems as described above, and is aimed to provide a light emitting element having higher emission efficiency by reducing uneven distribution of the current density between the electrodes, or the like.

The embodiments include the aspects described below. A light emitting element includes a first conductivity type semiconductor layer, a first electrode disposed on a region of the first conductivity type semiconductor layer, a second conductivity type semiconductor layer disposed on an another region of the first conductivity type semiconductor layer to surround the first electrode, and a second electrode disposed on the second conductivity type semiconductor layer. In a plan view, the second conductivity type semiconductor layer has an outer periphery in a square shape which includes a first diagonal line and a second diagonal line. The first electrode includes a first connecting portion arranged on the first diagonal line and a first extending portion extending from the first connecting portion on the first diagonal line. In at least one embodiment, the second electrode includes a second connecting portion arranged on the first diagonal line to face the first connecting portion via the first extending portion, and two second extending portions respectively include a first portion extending from the second connecting portion to each side of the first diagonal line, and a second portion extending from each first portion in a linear shape, interposing the first diagonal line with two second portions. The first connecting portion includes an end portion closer to the second connecting portion being arranged closer to the second connecting portion than a straight line intersecting the tip ends of the two second extending portions, and a center portion of the first connecting portion being arranged farther side from the second connecting portion than the second diagonal line. In the at least one embodiment, the second electrode includes a second connecting portion arranged on the first diagonal line to face the first connecting portion, and two second extending portions respectively include a first portion extending from the second connecting portion on each side of the first diagonal line, two second portions respectively extending from the corresponding first portion, interposing the first extending portion and in parallel to the first extending portion. The first connecting portion is arranged so that an end portion closer to the second connecting portion is arranged closer to the second connecting portion than a straight line intersecting the tip ends of the two second extending portions.

With the light emitting element according to the various embodiments of the present invention, the emission efficiency can be further improved.

DETAILED DESCRIPTION OF THE EMBODIMENTS

Figure 1A:
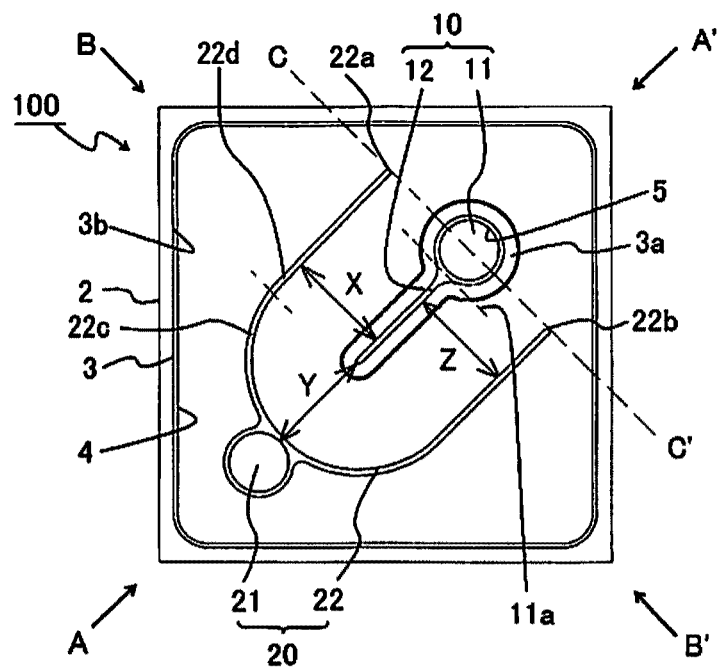
FIG. 1A is a plan view schematically showing a light emitting element according to Embodiment 1 of the present invention.

Embodiments for implementing the light emitting element of the present invention will be described below with reference to the accompanying drawings. The sizes and the arrangement relationships of the members in each of drawings are occasionally shown exaggerated for ease of explanation. Further, in the description below, the same designations or the same reference numerals may, in principle, denote the same or like members and duplicative descriptions will be appropriately omitted. In addition, a plurality of structural elements of the present invention may be configured as a single part which serves the purpose of a plurality of elements, on the other hand, a single structural element may be configured as a plurality of parts which serve the purpose of a single element. Further, constitutions described in some of examples and embodiments can be employed in other examples and embodiments.

A light emitting element according to embodiments of the present invention mainly includes a first conductivity type semiconductor layer, a first electrode disposed on a region of the first conductivity type semiconductor layer, a second conductivity type semiconductor layer disposed on an another region of the first conductivity type semiconductor layer to surround the first electrode, and a second electrode disposed on the second conductivity type semiconductor layer.

In a plan view, the second conductivity type semiconductor layer has an outer periphery in a square shape which includes a first diagonal line and a second diagonal line in plan view. In the specification, the term "square" allows a ±5% variation in length of a side with respect to other sides and/or about 90±10 degrees variation in angle in the four corners. The corner portions may be rounded. A "diagonal line" as used herein is a line that extends from one corner of a square shape to a non-consecutive corner of a square shape.

First Conductivity Type Semiconductor Layer and Second Conductivity Type Semiconductor Layer.

The first conductivity type semiconductor layer and the second conductivity type semiconductor layer are constituent members of the light emitting portion of the light emitting element, and may have any one of homo structure, hetero structure, or double-hetero structure with MIS junction, PIN junction, PN junction or the like. An active layer which has a single quantum well structure or a multi-quantum well structure and is formed to a thin film producing quantum effect is disposed between those semiconductor layers. Of those structures, a structure having the first conductivity type semiconductor layer, the active layer, and the second conductivity type layer stacked in this order is preferably employed. If the first conductivity type semiconductor layer is an n-type, the second conductivity type semiconductor layer may be a p-type, which can be vice versa. The kind and material of the semiconductor layers are not specifically limited, and for example, gallium nitride-based semiconductor materials such as $In_XAl_YGa_{1-X-Y}N$ ($0 \le X$, $0 \le Y$, $X+Y \le 1$) can be preferably used.

The first conductivity type semiconductor layer and the second conductivity type semiconductor layer are generally stacked on a substrate. It is preferable that on the substrate, the first conductivity type semiconductor layer, the active layer, and the second conductivity type layer are stacked in this order. Examples of the material for the substrate include an insulating substrate such as sapphire ($Al_2O_3$) and spinel ($MgAl_2O_4$), silicone carbide (SiC), ZnS, ZnO, Si, GaAs, diamond, and an oxide substrate such as lithium niobate and neodymium gallate which are capable of forming a lattice matching with the nitride semiconductor.

First Electrode and Second Electrode

The first electrode is disposed on a region of the first conductivity type semiconductor layer. In a plan view, the first electrode is arranged at the inner side of the light emitting element. The first electrode is surrounded by the second conductivity type semiconductor layer. With this arrangement, electric current can be diffused all around the first electrode. The first electrode is, for example, directly or indirectly electrically connected to the first conductivity type semiconductor layer to supply electric current to the first conductivity type semiconductor layer, and includes a first connecting portion arranged on the first diagonal line, and a first extending portion extending from the connecting portion on the first diagonal line.

The second electrode is arranged on the second conductivity type semiconductor layer and in a plan view, to surround a part of the outer periphery of the first electrode. The second electrode is, for example, to supply electric current to the second conductivity type semiconductor layer, directly or indirectly connected to the second conductive-type semiconductor layer, and includes a second connecting portion and two second extending portions.

The second connecting portion is arranged to face the first connecting portion on the first diagonal line. In this case, the second conductive portion may be arranged to face the first connecting portion either with or without interposing the first extending portion.

The second extending portions include, as to be described below, a first portion extending from the second connecting portion to each side of the first diagonal line, and a second portion extending from each first portion. In order to supply electric current more sufficiently on the entire surface of the second conductivity type semiconductor layer, it is preferable to further arrange a light-transmissive electrically-conducting layer, as to be described below, between the second electrode, that is the second connecting portion and the second extending portion, and the second conductivity type semiconductor layer, on approximately entire surface of the second conductivity type semiconductor layer. In the specification, the term "approximately entire surface" refers a planar dimension which is about 90% or greater with respect to the total planar dimension of the upper surface of the second conductivity type semiconductor layer.

The first connecting portion and the second connecting portion are so-called pad electrodes to connect the light emitting element with corresponding external electrodes, external terminals, or the like, to supply current to the light emitting element, and for example, serve as portions to which conductive wires etc., are connected respectively. The first connecting portion and the second connecting portion are, as described above, both arranged on a single diagonal line (hereinafter referred to as a "first diagonal line") of the semiconductor layer. In the specification, the expression "arranged on a diagonal line" means that preferably the center of the connecting portion is on a diagonal line, but it also includes that a part of the connecting portion is arranged bridging over a diagonal line. It is preferable that the first connecting portion and the second connecting portion are respectively arranged symmetrically with respect to the first diagonal line.

The first connecting portion is preferably arranged on the first diagonal line in a range of about 15 to 45% from a diagonal corner, and the second connecting portion is preferably arranged on the first diagonal line in a range of about 10 to 35% from another diagonal corner.

The shapes of the first connecting portion and the second connecting portion can be adjusted appropriately according to the size of the light emitting element and the arrangement of the electrodes etc., and for example, a circular shape, a polygonal shape, or the like, can be employed. Among those, in view of easiness of wire bonding, a circular shape or a shape similar to a circular shape is preferable. The size of the first connecting portion and the second connecting portion can be adjusted appropriately based on the size of the light emitting element, the arrangement of the electrodes, and the like, and their largest length is preferably about 5 to 30%, about 5 to 20%, or about 10 to 20% of the length of a side of the semiconductor layer. The first connecting portion and the second connecting portion may have different shapes and sizes, but the same shape and size are preferable.

The first connecting portion is preferably arranged so that an end portion closer to the second connecting portion is arranged closer to the second connecting portion than a straight line intersecting the tip ends of the two second extending portions. The center portion of the first connecting portion may be arranged on the second diagonal line or closer to the second connecting portion than the second diagonal line, but preferably arranged farther side from the second connecting portion than the second diagonal line. Further, it is more preferable that an end portion of the first connecting portion which is closer to the second connecting portion is arranged further from the second connecting portion than the second diagonal line.

The first extending portion and the second extending portions are auxiliary electrodes for uniformly diffusing the electric current supplied to the first connecting portion and the second connecting portion to the semiconductor layer. It is preferable that the first extending portion and the second extending portions are respectively arranged symmetrically with respect to the first diagonal line.

It is preferable that the first extending portion extends from the first connecting portion onto the first diagonal line, toward the second connecting portion. The first extending portion may extend in a direction opposite to the direction toward the second connecting portion. In the present specification, a portion extending from the first connecting portion is referred to a "first extending portion", but in order to distinguish the extending direction, an extending portion which extends in an opposite direction to a direction toward the second connecting portion is referred to a "first auxiliary extending portion". The first extending portion preferably has a length in a range of about 50 to 300% with respect to the diameter of the first connecting portion. The first auxiliary extending portion preferably has, depending on the position of the first connecting portion, a length in a range of about 10 to 200% with respect to the diameter of the first connecting portion. The first extending portion may further include a first auxiliary extending portion in addition to the portion extending toward the second connecting portion. That is, the first extending portion may include two extending portions which, on the first diagonal line, extend from the first connecting portion in opposite directions with each other. With this arrangement, the electric current can be spread also to the corner portions of the semiconductor layers which may generally have insufficient supply of electric current.

The second extending portion includes a first portion extending from the second connecting portion to both sides of the first diagonal line, and a second portion extending from each end of the first portions.

The first portions preferably extend from the second connecting portion in a curve.

The second portions extend in a linear shape with interposing the first extending portion. Also, the second portions preferably extend in parallel to the first extending portion.

The two first portions extending in a curved shape from the second connecting portion have, a shape as a conjugation of two first portions in a plan view, for example, a circular arc shape, a bowl shape, a semicircular shape, or the like, of those, the two first portions are more preferably arranged in a semicircular shape. The distance between the tip ends or the diameter of the semicircular shape of the two first portions is, for example, preferably about 2 to 10 times, about 2 to 5 times, or about 3 to 5 times with respect to the diameter of the second connecting portion, or from a different view point, about 10 to 40%, about 10 to 35%, or about 15 to 35% with respect to the diagonal length of the semiconductor layer.

The second portions are preferably extend in a straight-line shape from the respective first portions so as to face the first extending portion and/or substantially in parallel to the first extending portion.

The second extending portions may further include two auxiliary extending portions respectively branching from the first portions.

The width of the first extending portion and the second extending portions, and the first auxiliary extending portion and the second auxiliary extending portions are not specifically limited. For example, a width of about 5 to 30%, about 5 to 20%, or about 5 to 15% with respect to the diameter or the largest length of the first connecting portion and the second connecting portion is respectively preferable. The first extending portion and the second extending portions, and the first auxiliary extending portion and the second auxiliary extending portions may have different widths from each other, but a same width is preferable. The width of each portion may differ partially, but a uniform width is preferable.

The shortest distance between the first extending portion and the second connecting portion may be greater than the shortest distance between the first extending portion and the second portion of the first extending portion, or the shortest distance between the first extending portion and the first portion of the second extending portion may be smaller than the shortest distance between the first extending portion and the second portion of the second extending portion.

If the distance between the tip portion of the first extending portion which is close to the second connecting portion and the second connecting portion is small, the electric current tends to crowd between them. But setting this distance greater than the shortest distance between the first extending portion and the second portion of the second extending portion allows uniform dispersion of the electric current not only between the first extending portion and the second connecting portion but also between the first extending portion and the second extending portion. With this arrangement, the electric current can be dispersed efficiently to the second electrode (the second extending portions) and further to the second conductivity type semiconductor layer.

The shortest distances between the first extending portion and the two second extending portions respectively are preferably the same. Also, the first extending portion and the linearly extending second extending portions (the second portions) are preferably arranged substantially parallel to each other.

With this arrangement, the electric current which tends to concentrate around the second connecting portion can be adjusted uniformly by the differences in the distances as described above.

In the present specification, the intersection of the first portion and the second portion is included in the second portion.

The first electrode and the second electrode are generally arranged such that a planar dimension of the outer edge of the first electrode and the second electrode, which are arranged on the semiconductor layer, enclosed by a rectangular shape is preferably 60 to 90%, more preferably 70 to 90% with respect to the planar dimension of the light-transmissive electrically-conducting layer to be described below. With this arrangement, can be supplied uniformly on approximately the entire upper surface of the semiconductor layer. In addition, the planar dimension of the electrodes (the first electrode and the second electrode) occupying the upper surface of the semiconductor layer can be reduced, so that absorption of light by the electrodes can be reduced, thus, deterioration in the light extraction efficiency can be reduced.

Particularly, the rectangular shape enclosing the outer edge of the first electrode and the second electrode is preferably a similar shape or an approximately similar shape as the external shape of the light emitting element or the external shape of the second conductivity type semiconductor layer, with a size scaling down toward the gravity point of the light emitting element. With a shape as described above, more uniform supply of electric current can be realized. In the specification, the expression "(a) rectangular shape enclosing the outer edge of the first electrode and the second electrode" refers to a rectangular shape which is in contact with the end portions arranged outermost side of the first electrode and the second electrode, and is enclosed by lines substantially parallel with the periphery of the light emitting element or the second conductivity type semiconductor layer. Also, in the specification, the expression "(an) approximately similar shape" allows about a ±10% variation in scale reduction of one or more sides with respect to other sides.

For the first electrode and the second electrode, for example, a single-layer or a multi-layer of metal or alloy of Ni, Rh, Cr, Au, W, Pt, Ti, Al, etc., can be used, among those, a multi-layer of Ti/Pt/Au, Ti/Rh/Au, or the like, respectively stacked in this order is preferably used.

(Electrically-Conducting Layer)

Particularly, the electrically-conducting layer disposed between the second electrode (the second connecting portion and the second extending portion) and the second conductivity type semiconductor layer is for supplying the electric current supplied from the second electrode uniformly into the entire surface of the second conductivity type semiconductor layer. For the electrically-conducting layer, a metal thin layer can be used, but the electrically-conducting layer is disposed at the light extracting surface-side of the light emitting element, a light-transmissive electrically-conducting layer, more specifically, a conductive oxide layer is preferably used. Examples of the electrically conductive oxide include an oxide containing at least one selected from the group consisting of Zn, In, Sn, and Mg, and more specifically, $ZnO$, $In_2O_3$, $SnO_2$, ITO (Indium Tin Oxide; ITO), IZO (Indium Zinc Oxide), GZO (Gallium doped Zinc Oxide) and the like. A conductive oxide (particularly ITO) is a material which exhibits high light transmissivity (for example, 60% or greater, 70% or greater, 75% or greater, or 80% or greater) to visible light (in the visible light region) and has a relatively high electric conductivity, so that can be used preferably.

The light emitting element according to the embodiments is generally packaged to constitute a light emitting device. In the light emitting device, the light emitting element is mounted on a base member and enclosed with a sealing member. In this case, the light emitting element can be mounted either in a face-up manner or in a face-down manner.

The base body is generally constituted with a wiring and an insulating material. The wiring is used to supply electric power to the electrode of the light emitting element. For this purpose, any electrically conductive materials which can serve this function can be used. As for such materials, appropriate materials can be selected from the materials described above used for the first electrode etc. Examples of the insulating materials include ceramics, resins, dielectric materials, pulps, glass or composite materials of those, or complex materials of those materials and electrically conductive materials (for example, metal, carbon, etc).

The wiring member and the insulating material may be formed integrally in an approximately rectangular parallelepiped shape or an approximately cuboid shape, or a recess may be formed in any portion for mounting the light emitting element.

The sealing member is used to protect the light emitting element and the connecting members such as a wire from external environment, and any materials which allow efficient extraction of light from the light emitting element can be employed for the sealing member. For example, a light transmissive resin can be employed.

The light-transmissive resin allows penetration of light, which is 60% or greater of light emitted from the light emitting layer, and further preferably allows penetration of 70% or greater, 80% or greater, or 90% or greater of light emitted from the light emitting layer. Examples of such resin include a silicone resin composition, a modified silicone resin composition, an epoxy resin composition, a modified epoxy resin composition, an acrylic resin composition, a silicone resin, an epoxy resin, a urea resin, a fluororesin, or a hybrid resin containing one or more of those resins. In order to distribute light emitted from the light emitting element in a specific direction, a reflective member or a resin may be disposed at a periphery of such a light-transmissive resin member.

Examples of reflective resin include a thermosetting resin and a thermoplastic resin. Specific Examples of such a resin include an epoxy resin composition; a silicone resin composition; a modified epoxy resin composition such as a silicone modified epoxy resin; a modified silicone resin composition such as an epoxy modified silicone resin; a polyimide resin composition, a modified polyimide resin composition, polyphthalamide (PPA), a polycarbonate resin; a polyphenylene sulfide (PPS); a liquid crystal polymer (LCP); an ABS resin (an acrylonitrile-butadiene-styrene resin); a phenolic resin; an acrylic resin; and a PBT resin (polybutylene terephthalate resin). The reflective member can be formed with such a resin or further disposing a metal layer or the like, on the surface of the resin.

The sealing member may contain a light-scattering material, an inorganic filler, or the like, which is a known material in the art.

The light extracting surface-side of the light emitting device preferably has a fluorescent material layer. The fluorescent material layer may be made of a sealing member containing a fluorescent material. Also, a fluorescent material may be contained in a part of the surface of the sealing member.

For the fluorescent material contained in the fluorescent material layer, a known fluorescent material known in the art may be employed. For example, in the case where a gallium nitride based light emitting element to emit blue light is used as the light emitting element, fluorescent materials to absorb blue light, such as a YAG-based fluorescent material or a LAG-based fluorescent material to emit yellow to green light, a SiAlON-based fluorescent material (β-sialon-based fluorescent material) to emit green light, and a SCASN-based fluorescent material and a CASN-based fluorescent material to emit red light, can be used singly or in combination. A light-scattering material etc., known in the art may be contained.

Alternatively to the fluorescent material layer, a sealing member made of a light-transmissive resin described above which does not contain a fluorescent material may be disposed.

Two or more kinds of fluorescent material layer and/or the sealing member described above may be stacked.

Embodiment 1

Figure 1B:
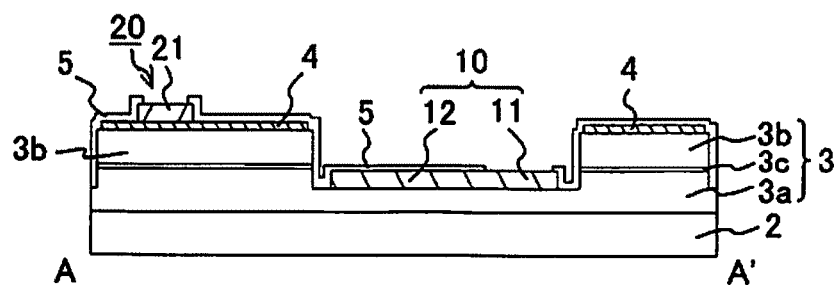
FIG. 1B is a schematic cross-sectional view taken along line A-A' of FIG. 1A.

A light emitting element 100 according to Embodiment 1 includes, as shown in FIG. 1A and FIG. 1B, a substrate 2, a semiconductor layer 3 arranged on the substrate 2, a first electrode 10 disposed on the semiconductor layer 3, and a second electrode 20 arranged over the semiconductor layer 3 and outer periphery of the first electrode 10.

The semiconductor layer 3 includes a first conductivity-type semiconductor layer 3a (for example, an n-layer), an active layer 3c, and a second conductivity-type semiconductor layer 3b (for example, a p-layer).

The substrate 2 and the semiconductor layer 3 (particularly, the second conductivity-type semiconductor layer 3b) has an approximately square shape in a plan view. For example, the length of a side of the substrate 2 is 460 µm.

The first electrode 10 is disposed on the first conductivity-type semiconductor layer 3a which is exposed by removing a part of the second conductivity-type semiconductor layer 3b and the active layer 3c. The first electrode 10 is surrounded by those second conductivity-type semiconductor layer 3b and the active layer 3c. The second electrode 20 is disposed on the second conductivity-type semiconductor layer 3b. Also, a light-transmissive electrically-conducting layer 4 which is disposed on approximately the entire surface of the second conductivity-type semiconductor layer 3b is arranged between the second electrode 20 and the second conductivity-type semiconductor layer 3b.

The semiconductor layer 3, the first electrode 10, and the second electrode 20 are covered with a protective layer 5 except for a part of the first connecting portion and the second connecting portion to be described below.

The first electrode 10 includes a first connecting portion 11 to be electrically connected with an external circuit (not shown) and a first extending portion 12 extending from the first connecting portion 11. The first connecting portion 11 is arranged on a line A-A' (herein after the first diagonal line A-A'), and for example, has an approximately circular shape with a radius of about 30 µm. The first extending portion 12 is extending toward the second connecting portion 21 to be described below. For example, the first extending portion 12 has a width of about 6 µm and a length of about 130 µm.

The second electrode 20 includes a second connecting portion 21 to be electrically connected with an external circuit (not shown) and two second extending portions 22 extending from the second connecting portion 21. The second connecting portion 21 is arranged on a portion of the first diagonal line A-A' which is a first diagonal line, and for example, the second connecting portion 21 has an approximately circular shape with a radius of about 30 µm. The two second extending portions 22 are symmetrical with respect to the first diagonal line A-A', and respectively have a first portion 22c extending in a curved line and a second portion 22d extending in a straight line, from the first portion 22c toward opposite side to the second connecting portion 21 (in other words, toward the first connecting portion 11 side). In the present embodiment, the shape extending in a curved line includes, for example, two the first portions 22c respectively extending in a curved line shape form an approximately semicircular shape, with a radius of, for example, about 110 µm. The second portions 22d respectively extending in a straight line are substantially in parallel to the first diagonal line, with a length of about 170 µm. The two second extending portions 22 define an overall U-shape in a plan view, as shown in FIG. 1A.

The first connecting portion 11 has an end portion 11a, which is closer to the second connecting portion 21, arranged closer-side to the second connecting portion 21 than a straight line C-C' connecting two tip portions 22a and 22b of the second portions 22d of the respective second extending portions 22. In the present specification, the expression "an end portion of the first connecting portion 11" refers to the outer edge of the first connecting portion 11. At a portion where the first connecting portion 11 and the first extending portion are connected, an outer periphery of the first connecting portion 11 (for example, an outer periphery of a circular shape) is assumed. The expression "(an) end portion 11a, which is closer to the second connecting portion 21" refers to an intersection point of the outer periphery of the assumed circular shape of the first connecting portion 11 and the first diagonal line. Further, the center portion of the first connecting portion 11 is arranged at a farther side from the second connecting portion 21 than the second diagonal line B-B' of the semiconductor layer 3, which intersects with the first diagonal line A-A' approximately perpendicularly. That is, the first connecting portion 11 is arranged in a bridged manner over the straight line C-C'. The straight line C-C' is parallel to the second diagonal line B-B'. Further, the straight line C-C' intersects the two tip portions 22a and 22b of the second extending portions 22. The first connecting portion 11 is arranged so that the shortest distance between the outer periphery of the first connecting portion 11 and the second extending portion is shorter than the shortest distance between the outer periphery of the first connecting portion 11 and the outer periphery of the semiconductor layer 3.

The first electrode 10 and the second electrode 20 are arranged in a region with a scale reduction of about 70% centered at the center of the semiconductor layer 3. In other words, when assuming four straight lines which are respectively in contact with the end portions at outermost sides of the first electrode 10 and the second electrode 20, and in parallel with the four outer edges of the semiconductor layer 3, the planar dimension surrounded with the four straight lines has a scale reduction ratio of approximately 70% with respect to the planar dimension of the electrically-conducting layer 4 (70% of the overall surface area of the electrically-conducting layer 4).

The first extending portion 12 is arranged at an approximately equal shortest distance to the second portions 22d of the second extending portions 22 extending in a straight-line shape from the first extending portion 12. In other words, the shortest distances between the first extending portion 12 and the second portions 22d of the second extending portions 22 indicated by the arrows X and Z in FIG. 1A are approximately the same. Also, the distance Y between the tip portion of the first extending portion 12 and the second connecting portion 21 opposite to the tip portion on the first diagonal first diagonal line A-A', and respective distances between the tip portion of the first extending portion 12 and the two first portions 22c of the second extending portions 22 extending in a curved line shape opposite to the tip portion are approximately the same. More specifically, for example, X, Z and Y are equal and in the depicted embodiment, X=Z=Y=107 μm.

Variant Example 1 of Embodiment 1

Figure 1C:
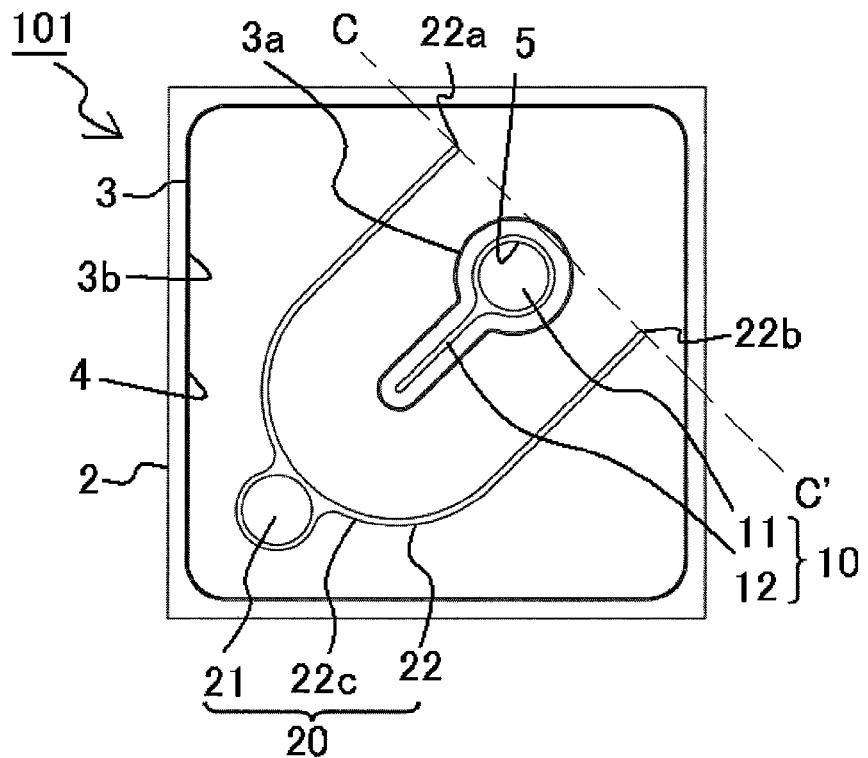
FIG. 1C is a plan view schematically showing a first variant example of a light emitting element according to Embodiment 1 of the present invention.

Also, as shown in FIG. 1C, a light emitting element 101 has a substantially similar structure as the light emitting element 100, as the light emitting element 101 includes a substrate 2, a semiconductor layer 3 disposed on the substrate 2, a first electrode 10 disposed on the semiconductor layer 3, and a second electrode 20 arranged over the semiconductor layer 3 and at outer periphery of the first electrode 10.

Also, the entire of the first connecting portion 11 is disposed closer side to the second connecting portion 21 than the a straight line C-C' intersecting the two tip portions 22a and 22b of the second portions 22d of the respective second extending portions 22. As shown in FIG. 1C, the straight line C-C' is spaced apart from the first electrode 10. With this arrangement, the distance between the first connecting portion 11 and the second connecting portion 21 can be reduced, so that resistance between the first connecting portion 11 and the second connecting portion 21 can be reduced.

Variant Example 2 of Embodiment 1

Figure 1D:
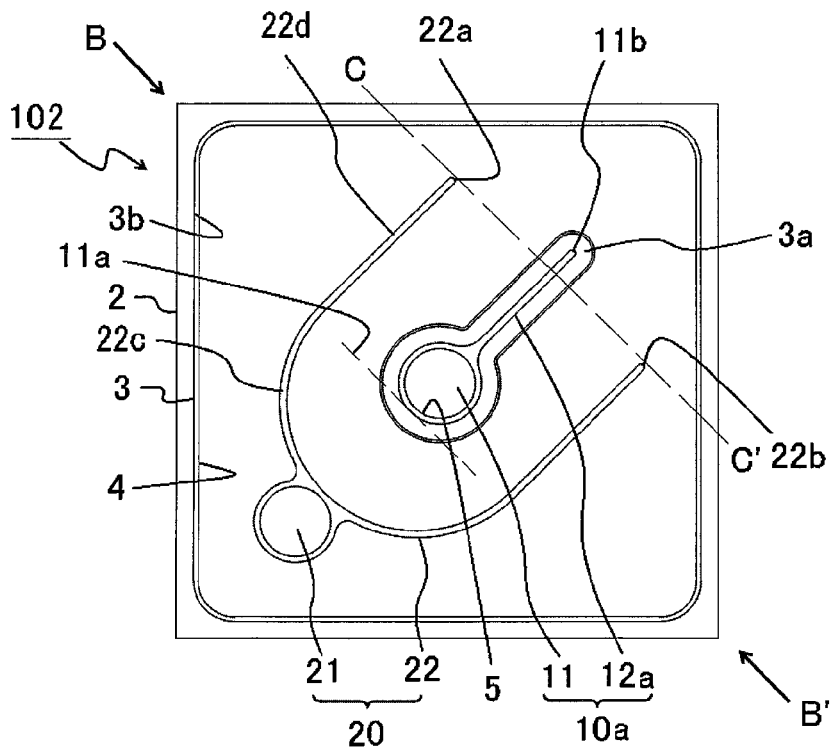
FIG. 1D is a plan view schematically showing a second variant example of a light emitting element according to Embodiment 1 of the present invention.

Also, as shown in FIG. 1D, a light emitting element 102 has a substantially similar structure as the light emitting element 100, as the light emitting element 102 includes a substrate 2, a semiconductor layer 3 disposed on the substrate 2, a first electrode 10a disposed on the semiconductor layer 3, and a second electrode 20 arranged over the semiconductor layer 3 and at outer periphery of the first electrode 10a.

The first electrode 10a includes a first connecting portion 11 and a first auxiliary extending portion 12a extending from the first connecting portion 11.

The first connecting portion 11 is arranged on the second diagonal line B-B' and the center portion of the first connecting portion 11 is on the second diagonal line B-B'. Thus, the first connecting portion 11 is arranged so that the end portion 11a of the first connecting portion 11 which is close to the second connecting portion 21 is closer side to the second connecting portion 21 than the straight line C-C' intersecting the two tip portions 22a and 22b of the second portions 22. Further, the first connecting portion 11 is arranged closer side to the second connecting portion 21 than the second diagonal line B-B'.

The first auxiliary extending portion 12a extends toward the opposite side from the second connecting portion 21. That is, the first connecting portion 11 faces the second connecting portion 21 on the first diagonal line. The end portion 11b of the first auxiliary extending portion 12a is arranged on a side opposite from the second connecting portion 21 relative to the straight line C-C' intersecting the two tip portions 22a and 22b of the second portions 22d of the respective second extending portions 22. In other words, the first auxiliary extending portion 12a is arranged in a bridged manner over the straight line C-C' which intersects the two tip portions 22a and 22b of the second extending portion 22. The first auxiliary extending portion 12a has a length approximately similar to the length of the first extending portion 12 of the light emitting element 100.

The second electrode 20 includes a second connecting portion 21 and two second extending portions 22 extending from the second connecting portion 21. The two second extending portions 22 respectively include a first portion 22c extending from the second connecting portion 21 in a curved line shape and a second portion 22d extending approximately in parallel to the first auxiliary extending portion 12a, from the first portion 22c toward the opposite side from the second connecting portion 21.

Embodiment 2

Figure 2A:
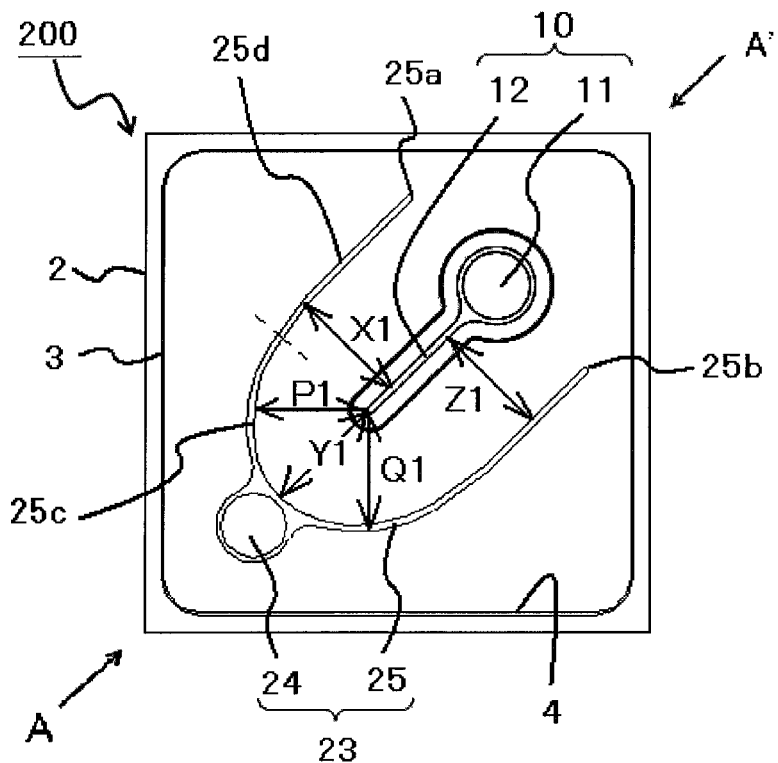
FIG. 2A is a plan view schematically showing a light emitting element according to Embodiment 2 of the present invention.

A light emitting element 200 according to Embodiment 2 has, as shown in FIG. 2A a substantially similar structure to the light emitting element 100 of Embodiment 1, except that the two second extending portions 25 of the second electrode 23 have different shapes than that of the light emitting element 100.

The light emitting element 200 has, in a plan view, the first portions 25c of the two second extending portions 25 are arranged in a shape which is somewhat more concave toward the periphery of the semiconductor layer 3 in their respective middle portion than a corresponding circular arc shape. It is preferable that the shape formed with the second extending portions 25 is more concave than a corresponding semicircle and is bulging outward from the two sides of an isosceles triangle formed by two ends of the first portions 25c and the second connecting portion 24.

The first extending portion 12 is arranged to have a substantially equal shortest distances from any points on the first extending portion 12 to the second portions 25d of the second extending portions 25. In other words, the shortest distances between the first extending portion 12 and the second portions 22d of the second extending portions 25 indicated by the arrows X1 and Z1 in FIG. 2A are approximately the same.

Meanwhile, on the first diagonal line A-A', distances (P1, Q1) from the tip portion of the first extending portion 12 to the first portions 25c of the second extending portions 25 respectively are smaller than the distance (shown by an arrow Y1) from the tip portion of the first extending portion 12 to the second connecting portion 24 facing the tip portion of the first extending portion 12. The degree of reduction in distance can be, for example, about 1 to 10% of the distance indicated by the arrow Y1. More specifically, for example, X1=Z1=107 μm, Y1=110 μm, and P1=Q1=100 μm.

Variant Example of Embodiment 2

Figure 2B:
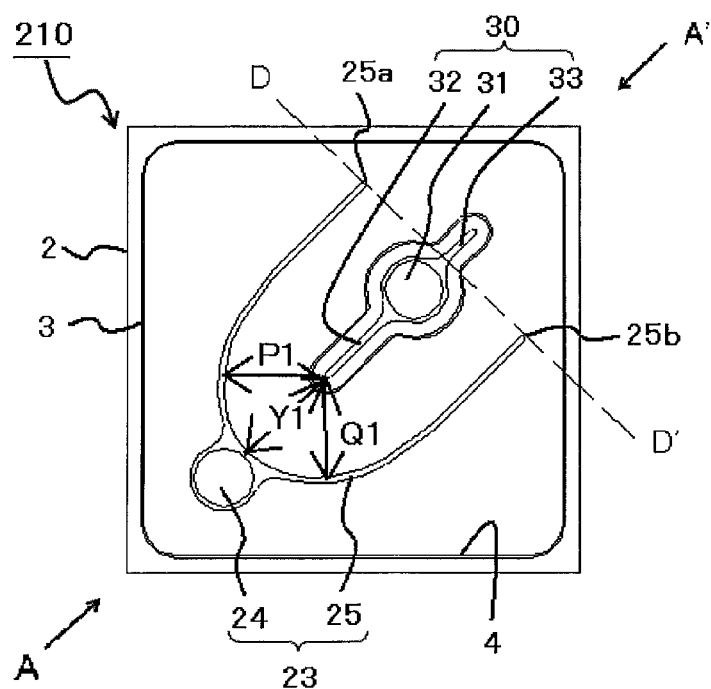
FIG. 2B is a plan view schematically showing a variant example of a light emitting element according to Embodiment 2 of the present invention.

As shown in the planar view in FIG. 2B, a light emitting element 210 may have a structure substantially approximate to that of the light emitting element 200 according to embodiment 2, except that the two second extending portions 25 of the second electrode 23 have a shape approximate to that of the light emitting element 200, the location of the first connecting portion 31 of the first electrode 30 is shifted along the first diagonal line A-A' toward the inner side of the light emitting element, with respect to that in the light emitting element 100, and that, on the first diagonal line A-A', in addition to the first extending portion 32 extending toward the second connecting portion 24, a first auxiliary extending portion 33 extending toward opposite side of the second connecting portion 24 is also disposed.

The first auxiliary extending portion 33 is preferably disposed on a straight line D-D' or the outer side (opposite direction from the first extending portion 32) than the straight line D-D' which intersects the two tip portions 25a and 25b of the second extending portions 25 extending in a straight line. With this arrangement, the electric current can be dispersed efficiently even to the corner portions of the semiconductor layer.

In the light emitting element 210, the distances (P1, Q1) from the tip portion of the first extending portion 32 to the first portions of the second extending portions 25 facing the tip portion respectively are shorter than the distance (indicated by arrow Y1) from the tip portion of the first extending portion 32 to the second connecting portion 24 facing the tip portion, which is similar to that in the light emitting element 200.

Embodiment 3

Figure 3:
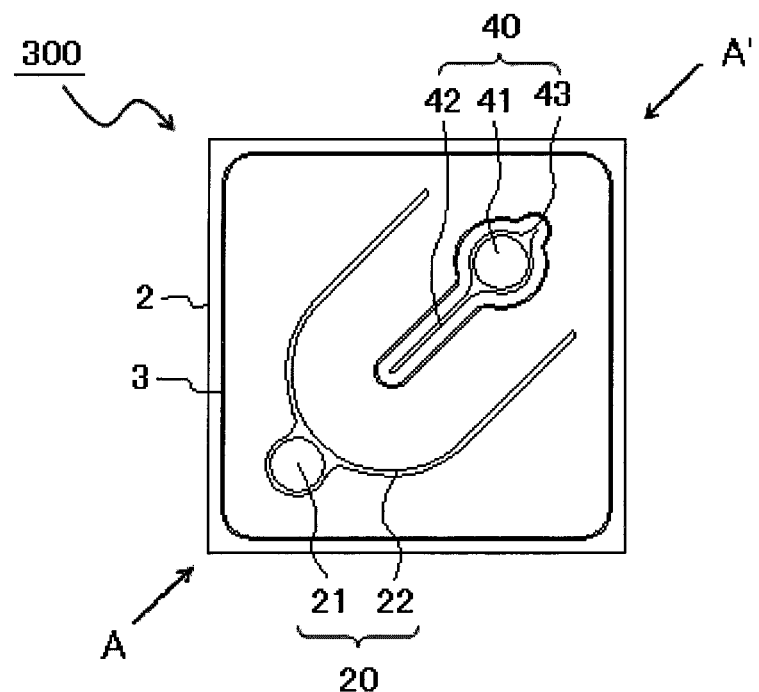
FIG. 3 is a plan view schematically showing a light emitting element according to Embodiment 3 of the present invention.

A light emitting element 300 according to Embodiment 3 has a substantially similar structure as that of the light emitting element 100 of Embodiment 1, except that as shown in FIG. 3, on the first diagonal line A-A', in addition to the first extending portion 42 extending from the first connecting portion 41 of the first electrode 40 toward the second connecting portion 21, a first auxiliary extending portion 43 extending toward opposite direction from the second connecting portion 21 is disposed. The first auxiliary extending portion 43 can have a length of about 15 µm. With this arrangement, electric current can be dispersed to the corner portion of the light emitting element in the vicinity of the first connecting portion.

Also in the light emitting element 300, the distances corresponding to the distances X, Z, and Y in the light emitting element 100 are approximate to that of the light emitting element 100.

Embodiment 4

Figure 4:
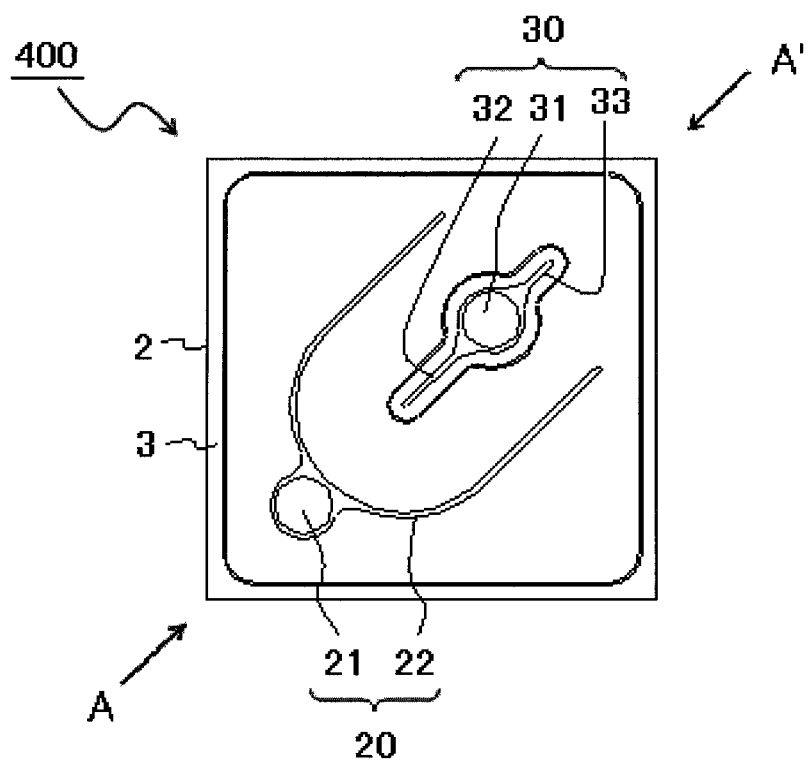
FIG. 4 is a plan view schematically showing a light emitting element according to Embodiment 4 of the present invention.

A light emitting element 400 according to Embodiment 4 has a substantially similar structure as that of the light emitting element 100 of Embodiment 1, except that as shown in FIG. 4, the location of the first connecting portion 31 of the first electrode 30 shifts along the first diagonal line A-A' toward the inner side of the light emitting element in a plan view, compared to that of the light emitting element 100, and also, in addition to the first extending portion 32 extending from the first connecting portion 31 toward the second connecting portion 21 on the first diagonal line A-A', a first auxiliary extending portion 33 extending toward opposite direction from the second connecting portion 21 is disposed.

In the light emitting element 400, the length of the shift of the first connecting portion is about 63% with respect to the diameter of the first connecting portion and the length of the first auxiliary extending portion 33 is about 50 µm.

Also in the light emitting element 400, the distances corresponding to the distances X, Z, and Y in the light emitting element 100 (first embodiment) are approximate to that of the light emitting element 100.

Embodiment 5

Figure 5:
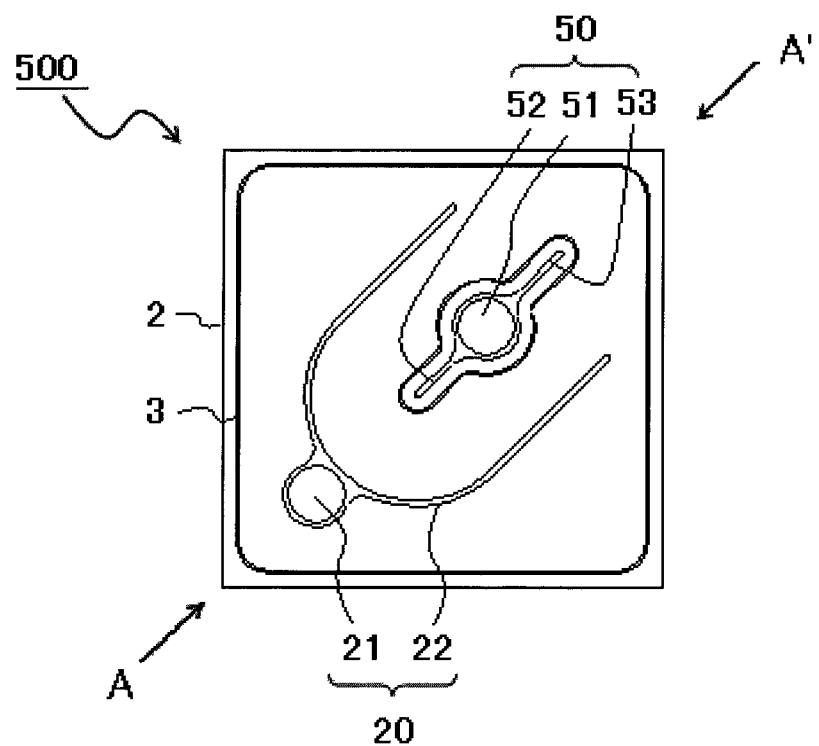
FIG. 5 is a plan view schematically showing a light emitting element according to Embodiment 5 of the present invention.

A light emitting device 500 according to Embodiment 5 has a substantially similar structure as that of the light emitting device 100 of Embodiment 1, except that as shown in FIG. 5, the location of the first connecting portion 51 of the first electrode 50 shifts toward the inner side of the light emitting element along the first diagonal line A-A' in a plan view, compared to that of the light emitting element 100, and also, in addition to the first extending portion 52 extending from the first connecting portion 51 toward the second connecting portion 21 on the first diagonal line A-A', a first auxiliary extending portion 53 extending toward opposite direction from the second connecting portion 21 is disposed.

In the light emitting element 500, the length of the shift of the first connecting portion is about 97% with respect to the diameter of the first connecting portion and the first auxiliary extending portion 53 is about 75 µm.

Also in the light emitting element 500, the distances corresponding to the distances X, Z, and Y in the light emitting element 100 (the first embodiment) are approximate to that of the light emitting element 100.

Embodiment 6

Figure 6:
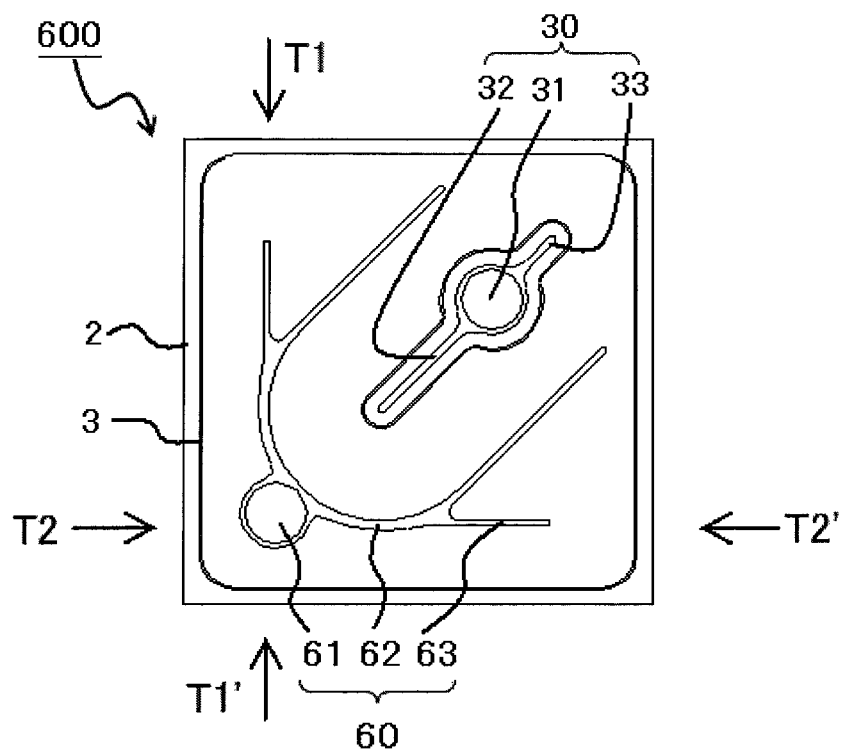
FIG. 6 is a plan view schematically showing a light emitting element according to Embodiment 6 of the present invention.

A light emitting element 600 according to Embodiment 5 has a substantially similar structure as that of the light emitting element 400 of Embodiment 4, except that as shown in FIG. 6, the second extending portions 62 of the second electrode 60 have two second auxiliary extending portions 63 respectively branching from the portion extending in a curved line shape from the second connecting portion 61.

In the light emitting element 600, when assuming lines parallel to sides of the semiconductor layer as tangent lines T1-T1' and T2-T2' with respect to the extending portion in a curved line shape, the second auxiliary extending portions 63, which are branch portions, extend along the tangent lines T1-T1' and T2-T2'. Further, the length of the second auxiliary extending portion 63 can correspond to about 25% of the length of a side of the semiconductor layer. Specifically, the length of the second auxiliary extending portion 63 can be about 110 µm.

Embodiment 7

Figure 7:
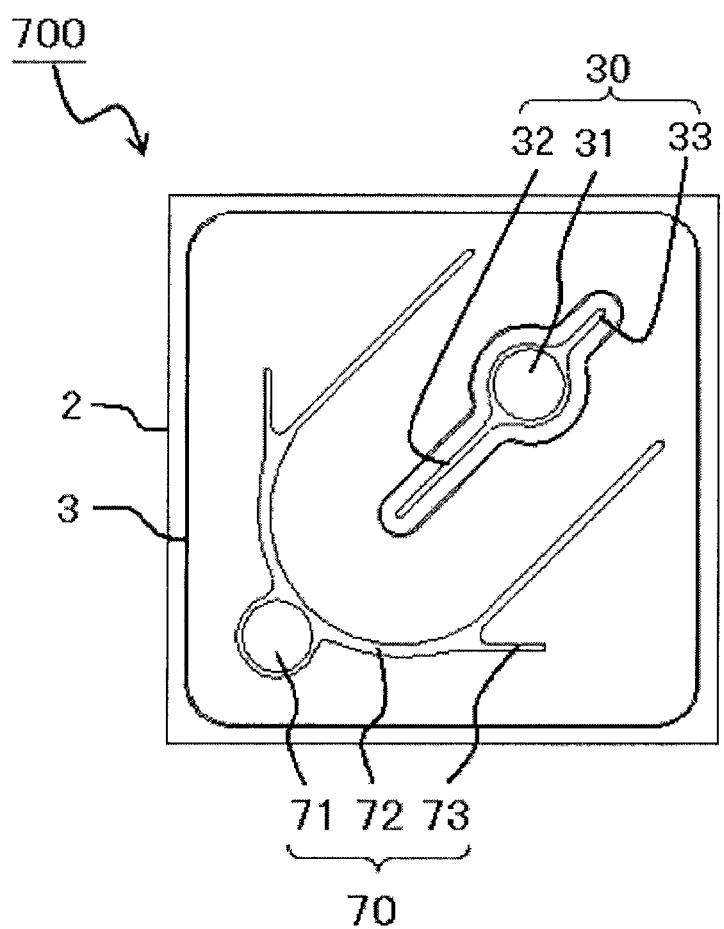
FIG. 7 is a plan view schematically showing a light emitting element according to Embodiment 7 of the present invention.

A light emitting element 700 according to Embodiment 7 has a substantially similar structure as that of the light emitting element 600 of Embodiment 6, except that as shown in FIG. 7, the second auxiliary extending portions 73 which are branch portions respectively branching from the portions extending in a curved line shape from the second connecting portion 71 of the second extending portion 72 of the second electrode 70, has a length which is about a half of the length of the second auxiliary extending portion 63 of the light emitting element 600 of Embodiment 6.

Evaluation of Light Emitting Element

The light emitting elements according to Embodiments 1 to 7 described above were evaluated.

The light emitting element having substantially similar structures as those of Embodiments 1 to 7 except for the arrangements of the electrodes as described below were prepared as Comparative Examples.

Comparative Example 1

Figure 8A:
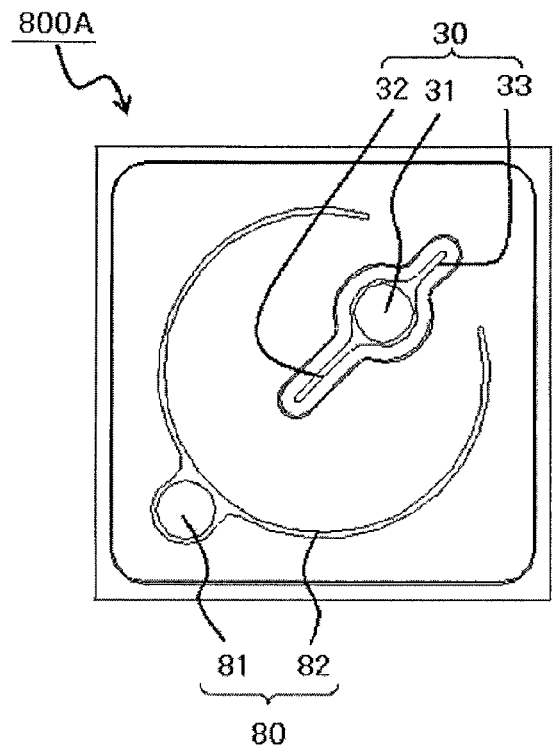
FIG. 8A is a plan view schematically showing a light emitting element according to Comparative Example 1.

As shown in FIG. 8A, the second electrode 80 in a light emitting element 800A includes the second extending portions 82 extending from the second connecting portion 81 has a circular shape which does not include a linear portion. The first electrode 30 is similar to the first electrode of the light emitting element 400.

Comparative Example 2

Figure 8B:
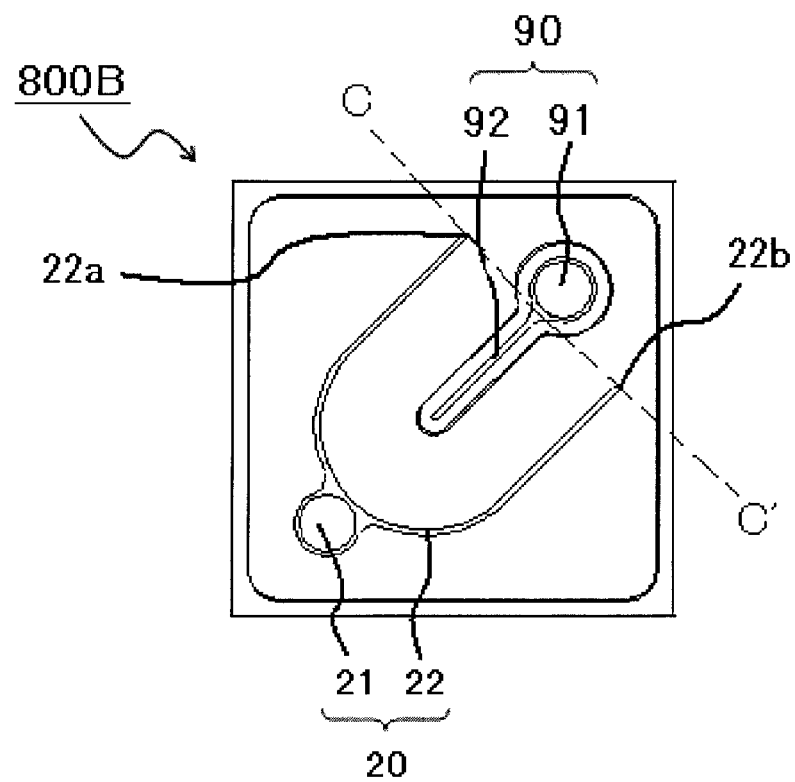
FIG. 8B is a plan view schematically showing a light emitting element according to Comparative Example 2.

As shown in FIG. 8B, a light emitting element 800B has a first electrode 90 in which the end portion of the first connecting portion 91, which is an extension of the first extending portion 92 and close to the second connecting portion 21 is arranged at a position in contact with the straight line C-C' which connects the two tip portions 22a and 22b of the second extending portions 22 extending in a straight line shape respectively. The second electrode 20 is similar to the second electrode of the light emitting element 100.

Evaluation of Optical Output Power and Forward Voltage (Vf)

The optical output power and Vf were measured at the electric current of 120 mA on the light emitting element 400, the light emitting element 210, and the light emitting element 800A.

Figure 9A:
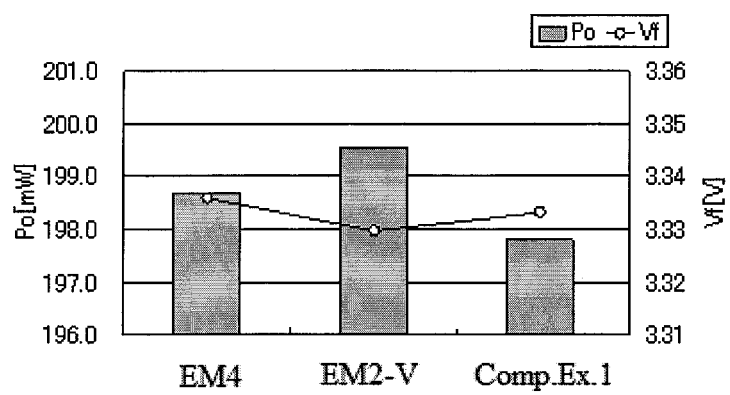
FIG. 9A is a graph showing the optical output power (Po) and the forward voltage (Vf) of the light emitting elements according to a Variant Example of Embodiment 2 and Embodiment 4 of the present invention and Comparative Example 1.

The results of the measurements are shown in FIG. 9A.

The results confirmed that the light emitting elements 400 and 210 of the present embodiment exhibit greatly high brightness compared to the light emitting element 800A of Comparative Example. This is attributed to a reduction of the lengths (planar dimensions) of the first electrode and the second electrode as little as possible, which allows reduction in the deterioration of optical output caused by blocking of light by the electrodes. Particularly, in the light emitting element 210, the distances of P1 and Q1 were smaller than X1 and Z1, which allowed a reduction in the overall length of the second extending portions compared to that of the light emitting element 400, which contributed to a higher optical output power than that of the light emitting element 400. Thus, it was confirmed that instead of employing an arrangement which allows an excessive current flow between the first electrode and the second electrode, considering the relationship between distances between the second extending portions and the first electrode allows achievement of an uniform current density throughout the entire surface of the semiconductor layer, and that in addition, the optical output power tends to increase.

Evaluation of Power Efficiency

Figure 9B:
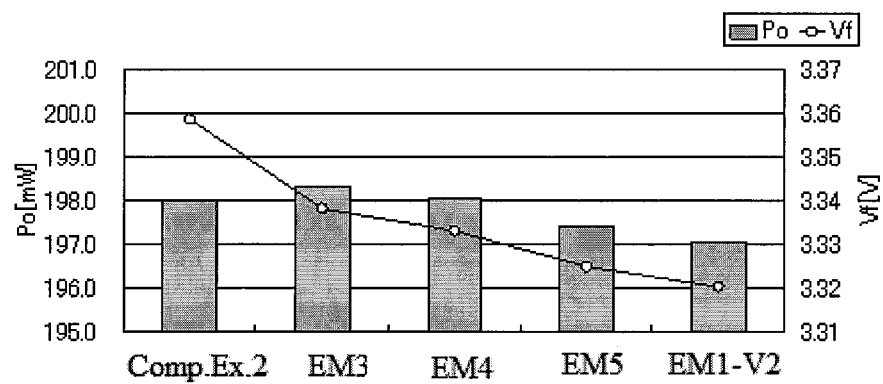
FIG. 9B is a graph showing the optical output power (Po) and the forward voltage (Vf) of the light emitting elements according to Embodiments 3, 4, and 5 of the present invention and Comparative Examples 2 and 3.

The optical output power, Vf, and power efficiency were evaluated at the current of 120 mA on the light emitting elements 300, 400, 500, 800B, and 102. The results are shown in FIG. 9B and Table 1. In the light emitting elements 300, 400, 500, 800B, and 102, the first electrodes (the first connecting portion and the first extending portion) have a same planar dimension, and only the positions of the first electrode differ. The power efficiency and the difference in power efficiency were calculated using the formulas: Power Efficiency (%)={optical output power/(electric current)×voltage}×100; Difference in Power Efficiency (%)=(Standard/Subject)× 100−100. The unit of optical output power is mW, the unit of electric current is mA, and the unit of voltage is V.

TABLE 1

| LIGHT EMITTING ELEMENT | Power Efficiency | Difference in Power Efficiency (%) |
|---|---|---|
| COMPARATIVE EXAMPLE 2 (Light emitting element 800B) | 49.13 | Standard |
| EMBODIMENT 3 (Light emitting element 300) | 49.51 | 0.77 |
| EMBODIMENT 4 (Light emitting element 400) | 49.51 | 0.78 |
| EMBODIMENT 5 (Light emitting element 500) | 49.48 | 0.72 |
| VARIANT EXAMPLE 2 OF EMBODIMENT 1 (Light emitting element 102) | 49.45 | 0.66 |

The results was evaluated regarding the light emitting element 800B as the standard, and a difference of 0.66% was obtained with the light emitting element 102 according to an embodiment of the invention. Further, the light emitting elements 300, 400, 500 according to the embodiments exhibited good results in the difference of 0.77, 0.78, and 0.72 respectively.

Further, a decrease in the Vf-values was observed when the distance between the first connecting portion and the second connecting portion decreases. Thus, the arrangement of the first connecting portion (the distance between the first connecting portion and the second connecting portion) was confirmed to affect the Vf-values.

Simulation of Current Density

Figure 10A:
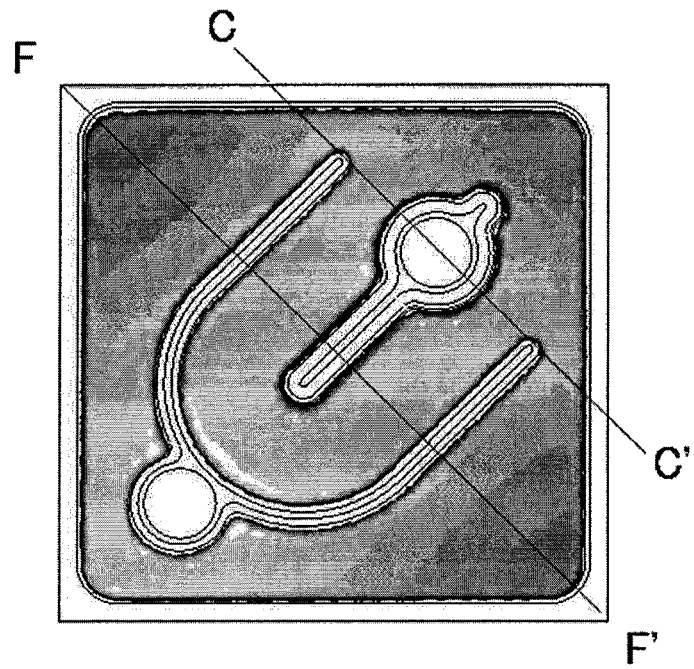
FIG. 10A is a schematic plan view showing current density of a light emitting element according to Embodiment 3 of the present invention.
Figure 10B:
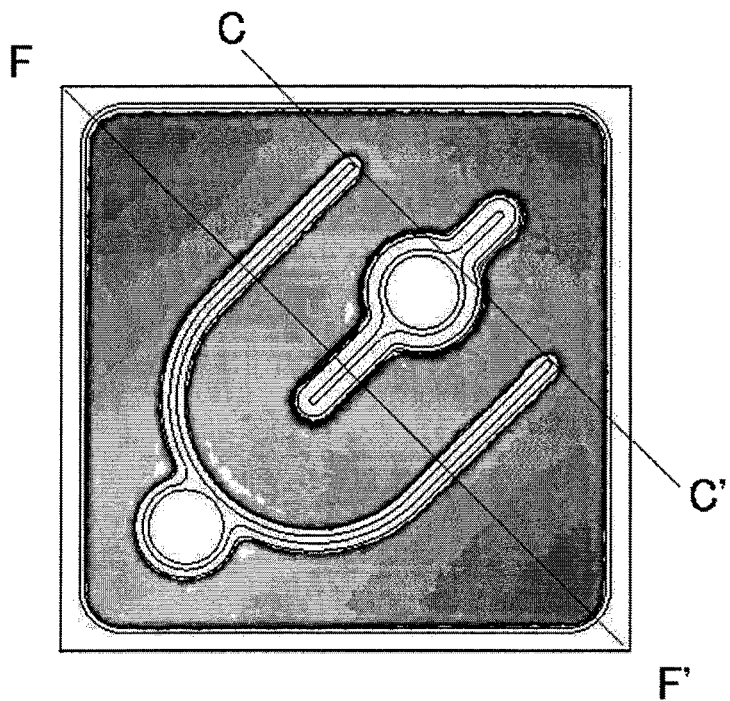
FIG. 10B is a schematic plan view showing current density of a light emitting element according to Embodiment 4 of the present invention.
Figure 10C:
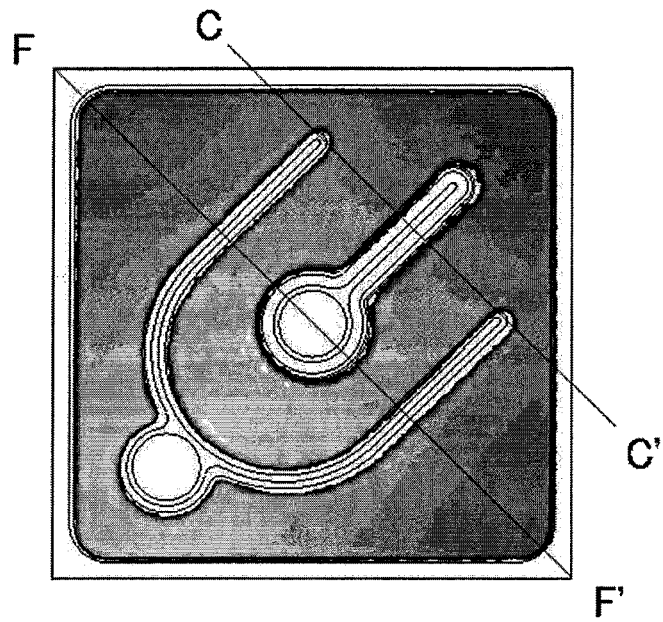
FIG. 10C is a schematic plan view showing current density of a light emitting element according to Variant Example 2 of Embodiment 1 of the present invention.

The distribution of current density in the light emitting elements 300, 400 and the light emitting element 102 was analyzed by using simulation software based on the finite element method. The results are shown in FIG. 10A to FIG. 10C respectively. In FIG. 10A to FIG. 10C, darker shading indicates a lower current density. Also, in FIG. 10A to FIG. 10C, a straight line C-C' connecting two tip portions 22a and 22b of the second portion 22d and a second diagonal line (F-F') are respectively shown for reference.

It was confirmed that in the light emitting element 102, particularly at the corner on the first diagonal line near the first connecting portion exhibits darker shading, which indicates a relatively larger area of low current density, but the current density is improved at the corners on the second diagonal line than the corner at the first connecting portion side on the first diagonal line. In the distribution of current density, a partial current crowding tends to occur, but with a balance with the Vf-value as shown in FIG. 9, an improvement of optical output power can be expected.

Meanwhile, in the light emitting elements 300 and 400, occurrence of darker portions at the corners of the light emitting elements were further prevented and current crowding was not observed between the electrodes, and a uniform distribution of current density was confirmed. As described above, an efficient improvement in the optical output power can be achieved on the entire surface of the semiconductor layer, so that the light emitting element of high luminance can be obtained.

Power Efficiency with Respect to Planar Dimension of Electrodes

The power efficiency was measured on the light emitting elements according to the embodiments and to the comparative example described above, with reducing the planar dimensions of a rectangular shapes which enclose the outermost peripheries of the first electrode and the second electrode with the center of the light emitting element as the reduction center, with respect to the planar dimension of the electrically-conducting layer. The measurement of the current efficiency was performed in a same manner as described above.

Figure 11:
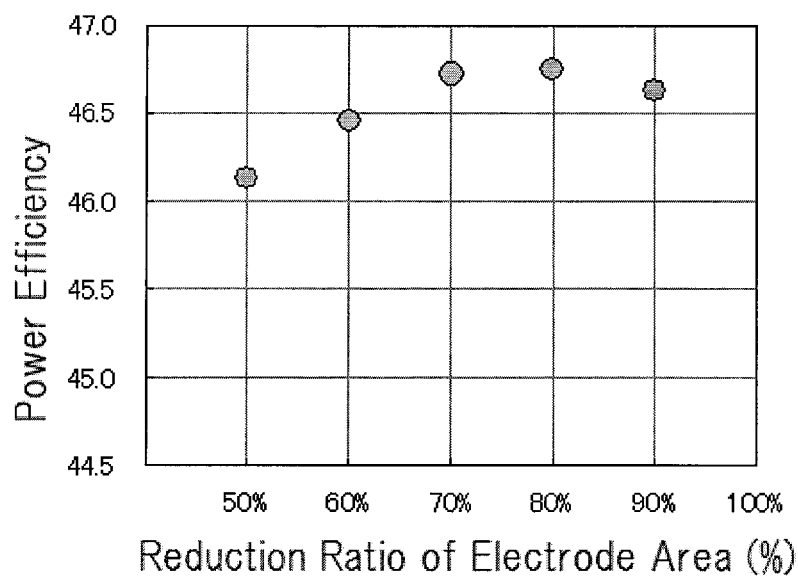
FIG. 11 is a graph showing a relationship between power efficiency and reduction rate of the area of the electrodes.
Figure 11:
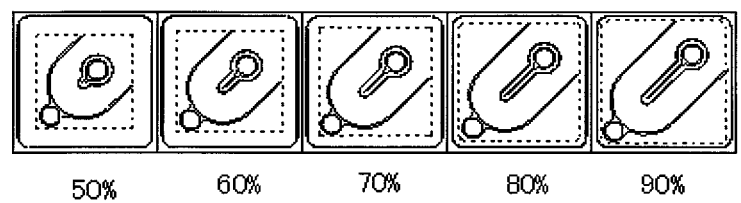

The results of the measurements are shown in FIG. 11.

The results confirmed that very good power efficiency can be obtained at about 70 to 90% of the reduction rate of the area of the electrodes. Also, it was confirmed that, with the scale reduction, the planar dimensions of the electrodes (the first electrode and the second electrode) occupying the upper surface of the semiconductor layer can be reduced, which allows adjustment between the power efficiency and the light extracting efficiency from the semiconductor layer.

Evaluation of Luminous Flux After Packaging

The light emitting element 400 (Embodiment 4) and the light emitting element 800A (Comparative Example 1) were mounted in the ceramic packages (length×width×height=3.5 mm×3.5 mm×0.8 mm) respectively, and the light emitting elements were respectively sealed with a silicone resin containing a YAG material to form the light emitting devices.

The optical output power of the light emitting devices was measured at a current of 120 mA.

The result confirmed that the light emitting device mounted with the light emitting element 400 has an improved optical output power of 0.5% higher value compared to the light emitting device mounted with the light emitting element 800A of Comparative Example 1.

In the light emitting element 400, arrangement of the first electrode and the second electrode having a good power efficiency has been realized, and associated reduction in the planar dimension of the extending portions of the electrodes with respect to the entire upper surface of the light emitting element is considered to be a factor of the improvement.

INDUSTRIAL APPLICABILITY

A light emitting element according to the present invention can be suitably employed for various lighting apparatuses, in particular, a light source for lighting, an LED display, backlight source for a liquid crystal display device, signals, a lighted switch, various sensors, various indicators, an auxiliary light source for moving image, other consumer light sources, or the like.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting element comprising:
a first conductivity type semiconductor layer,
a first electrode disposed on a region of the first conductivity type semiconductor layer;
a second conductivity type semiconductor layer disposed on an another region of the first conductivity type semiconductor layer to surround the first electrode; and
a second electrode disposed on the second conductivity type semiconductor layer; wherein
in a plan view,
the second conductivity type semiconductor layer has an outer periphery in a square shape which includes a first diagonal line and a second diagonal line;
the first electrode includes a first connecting portion arranged on the first diagonal line and a first extending portion extending from a first end portion of the first connecting portion on the first diagonal line;

the second electrode includes a second connecting portion arranged on the first diagonal line to face the first connecting portion via the first extending portion, and two second extending portions respectively including a first portion extending from the second connecting portion on each side of the first diagonal line, and a second portion extending from the first portion in a linear shape, interposing the first diagonal line with two second portions;
the first end portion of the first connecting portion being arranged between the second diagonal line and a straight line intersecting the tip ends of the two second extending portions; and
a second end portion of the first connecting portion, which is opposite from the first end portion, is disposed between the second connecting portion and the straight line intersecting the tip ends of the two second extending portions.

2. A light emitting element comprising:
a first conductivity type semiconductor layer,
a first electrode disposed on a region of the first conductivity type semiconductor layer;
a second conductivity type semiconductor layer disposed on an another region of the first conductivity type semiconductor layer to surround the first electrode; and
a second electrode disposed on the second conductivity type semiconductor layer; wherein
in a plan view,
the second conductivity type semiconductor layer has an outer periphery in a square shape which includes a first diagonal line and a second diagonal line;
the first electrode includes a first connecting portion arranged on the first diagonal line and a first extending portion extending from a first end portion of the first connecting portion on the first diagonal line;
the second electrode includes a second connecting portion arranged on the first diagonal line to face the first connecting portion, and two second extending portions respectively including a first portion extending from the second connecting portion on each side of the first diagonal line, two second portions respectively extending from the corresponding first portion, interposing the first extending portion and in parallel to the first extending portion;
the end portion of the first connecting portion being arranged between the second diagonal line and a straight line intersecting the tip ends of the two second extending portions; and
a second end portion of the first connecting portion, which is opposite from the first end portion, is disposed between the second connecting portion and the straight line intersecting the tip ends of the two second extending portions.

3. The light emitting element according to claim 1, wherein the two second extending portions of the second electrode respectively includes a first portion extending from the second connecting portion in a curved shape and a second portion extending from the first portion in a linear shape so as to face the first extending portion, and
a shortest distance between the first extending portion and the second connecting portion is equal to or greater than a shortest distance between the first extending portion and the second portion of the second extending portion.

4. The light emitting element according to claim 2, wherein the two second extending portions of the second electrode respectively includes the first portion extending from the second connecting portion in a curved shape and the second portion extending from the first portion in the linear shape so as to face the first extending portion, and a shortest distance between the first extending portion and the second connecting portion is equal to or greater than a shortest distance between the first extending portion and the second portion of the second extending portion.

5. The light emitting element according to claim 1, wherein shortest distances between the first extending portion and each of the two second extending portions are the same.

6. The light emitting element according to claim 3, wherein the two first portions of the second extending portions are arranged in a semicircular shape.

7. The light emitting element according to claim 4, wherein the two first portions of the second extending portions are arranged in a semicircular shape.

8. The light emitting element according to claim 1, wherein each of the two second extending portions of the second electrode includes a first portion extending in a curved shape from the second connecting portion and a second portion extending from the first portion in a linear shape so as to face the first extending portion, and the shortest distance between the first extending portion and the first portion is smaller than the shortest distance between the first extending portion and the second portion of the second extending portion.

9. The light emitting element according to claim 2, wherein each of the two second extending portions of the second electrode includes the first portion extending in a curved shape from the second connecting portion and the second portion extending from the first portion in the linear shape so as to face the first extending portion, and the shortest distance between the first extending portion and the first portion is smaller than the shortest distance between the first extending portion and the second portion of the second extending portion.

10. The light emitting element according to claim 1, wherein the first electrode further comprises a first auxiliary extending portion extending from the first connecting portion onto the first diagonal line, toward an opposite side to the second connecting portion.

11. The light emitting element according to claim 2, wherein the first electrode further comprises a first auxiliary extending portion extending from the first connecting portion onto the first diagonal line, toward an opposite side to the second connecting portion.

12. The light emitting element according to claim 1, wherein an end portion of the first connecting portion closer to the second connecting portion is arranged farther side from the second connecting portion than the second diagonal line.

13. The light emitting element according to claim 2, wherein an end portion of the first connecting portion closer to the second connecting portion is arranged farther side from the second connecting portion than the second diagonal line.

14. The light emitting element according to claim 1, wherein the second extending portions include two second auxiliary extending portions respectively branching from the first portion.

15. The light emitting element according to claim 2, wherein the second extending portions include two second auxiliary extending portions respectively branching from the first portion.

16. The light emitting element according to claim 1, further comprising a light-transmissive electrically-conducting layer between the second electrode and the second conductivity type semiconductor layer, and a planar dimension of an outer edge of the first electrode and the second electrode enclosed by a rectangular shape is 60 to 90% with respect to the planar dimension of the light-transmissive electrically-conducting layer.

17. The light emitting element according to claim 2, further comprising a light-transmissive electrically-conducting layer between the second electrode and the second conductivity type semiconductor layer, and a planar dimension of an outer edge of the first electrode and the second electrode enclosed by a rectangular shape is 60 to 90% with respect to the planar dimension of the light-transmissive electrically-conducting layer.

18. The light emitting element according to claim 2, wherein the center portion of the first connecting portion is on the second diagonal line.

19. The light emitting element according to claim 1, wherein the straight line intersecting the tip ends of the two second extending portions extends in parallel to the second diagonal line.

20. The light emitting element according to claim 1, wherein each of the two second extending portions of the second electrode includes a first portion extending in a curved shape from the second connecting portion.

21. The light emitting element according to claim 1, wherein, in the plan view, the first electrode is surrounded by the second conductivity type semiconductor layer, or the first electrode is arranged at an inner side of the light emitting element.

22. The light emitting element according to claim 1, wherein, in the plan view, the second electrode is surrounded by the second conductivity type semiconductor layer, or the second electrode is arranged at an inner side of the light emitting element.

23. The light emitting element according to claim 2, wherein the second portions of the second extending portions of the second electrode extend in parallel to the first diagonal line.

24. The light emitting element according to claim 2, wherein each of the first portions of the two second extending portions of the second electrode extends from the second connecting portion in a curved shape.

25. The light emitting element according to claim 2, wherein, in the plan view, the first electrode is surrounded by the second conductivity type semiconductor layer, or the first electrode is arranged at an inner side of the light emitting element.

26. The light emitting element according to claim 2, wherein, in the plan view, the second electrode is surrounded by the second conductivity type semiconductor layer, or the second electrode is arranged at an inner side of the light emitting element.

* * * * *